United States Patent [19]
Yamauchi

[11] Patent Number: 5,268,874
[45] Date of Patent: Dec. 7, 1993

[54] READING CIRCUIT FOR SEMICONDUCTOR MEMORY

[75] Inventor: Hiroyuki Yamauchi, Osaka, Japan

[73] Assignee: Matsushita Electric Industrial Co., Ltd., Osaka, Japan

[21] Appl. No.: 953,745

[22] Filed: Sep. 29, 1992

[30] Foreign Application Priority Data

Sep. 30, 1991 [JP] Japan ................. 3-250884

[51] Int. Cl.$^5$ ............................................. G11C 8/00
[52] U.S. Cl. ............................ 365/233.5; 365/189.06
[58] Field of Search ............ 365/233.5, 189.06, 233, 365/203

[56] References Cited

U.S. PATENT DOCUMENTS 4,730,279 3/1988 Ohtani ................. 365/233.5
4,926,384 5/1990 Roy ..................... 365/233.5

OTHER PUBLICATIONS

F. Miyaji et al., "A 25ns 4Mb CMOS SRAM with Dynamic Bit Line Loads", 1989 IEEE International Solid-State Circuits Conference, pp. 250-251, Feb. 17, 1989.

Primary Examiner—Eugene R. LaRoche
Assistant Examiner—A. Zavabian
Attorney, Agent, or Firm—Ratner & Prestia

[57] ABSTRACT

In a reading circuit for a semiconductor memory, connection between a bit line pair 3 and input line of a differential amplifier 4 is controlled using an address transition detection signal LTD. For equalizing the bit line pair 3 in pulse form after transition, the bit line pair 3 is connected to the input terminal of the differential amplifier 4 for a little longer period than the equalizing period, and for clamping the bit line pair 3, the bit line pair 3 and the input terminal of the differential amplifier 4 are disconnected from each other, thus allowing a high-speed, stable reading operation with large-scale capacity.

6 Claims, 16 Drawing Sheets

READING CIRCUIT FOR SEMICONDUCTOR MEMORY

BACKGROUND OF THE INVENTION

1. Field of the Invention

The present invention relates to a reading circuit for a semiconductor memory such as a dynamic random access memory (referred to as "DRAM" hereinafter) and a static random access memory (referred to as "SRAM" hereinafter), and in particular to a technique of a reading circuit effective to a semiconductor memory incorporating, for example, a sensing system for clamping a potential difference between a data pair read out of a memory cell.

2. Description of the Prior Art

The following describes a conventional reading circuit for a semiconductor memory with reference to FIGS. 14 through 16.

FIG. 14 shows a reading circuit for an SRAM incorporating a clamping system for clamping a potential difference between a bit line pair 3, FIG. 15 explains the operation of the reading circuit, and FIGS. 16(a) and 16(b) show typical memory cells 5 of SRAMs, where FIG. 16(a) depicts a memory cell 5 of a resistor load type, and FIG. 16(b) a memory cell of a complementary metal oxide semiconductor (referred to as "CMOS" hereinafter) type. Connecting relations between complementary bit lines BL, /BL (3), a word line WL (9), and the memory cell 5 are as shown in FIGS. 16(a) and 16(b).

Now the reading circuit shown in FIG. 14 is described in conjunction with the operation explanatory view of FIG. 15. An equalizer circuit made up of first, second, and third transistors 2a, 2b, and 2c serves to precharge and equalize a bit line pair 3 with respect to a supply voltage of a first power source 20 using an equalizing signal ATD fed via a first control line 6, obtained by inverting a transition detection signal LTD (indicated by a broken line in FIG. 15) for detecting transition of a column address 17 or a row address 16. The equalizer circuit made up of the transistors 2a, 2b, and 2c is controlled by a second control signal FF fed through a second control line (18) which represents an OR relation between a delay signal OFQ on a delay line (7) obtained from the transition detection signal LTD and a discrimination signal CEWE fed through a signal line (8) for discriminating whether a write cycle or a read cycle is in operation. The data stored in the memory cell 5 is read out to the bit line pair 3 by turning on the word line 9.

Meanwhile, a clamping circuit made up of fourth and fifth transistors 1a and 1b is turned off so as to release the clamping of the bit line pair 3 for a duration of a period from t=t0 to t=t1 upon completion of the equalizing operation effected by the equalizer circuit (2a, 2b and 2c). By this arrangement, the clamping operation of the clamping circuit (1a, 1b) can be prevented in a period when the data signal read out of the memory cell 5 to the bit line pair 3 is not enough large.

The potential difference during the release of the clamping by turning off the clamping circuit is further transferred to the subsequent stage, which is effected by connecting the bit line pair 3 to the input of a differential amplifier 4 through a sub-bit line pair SBL and /SBL (30) in the subsequent stage by feeding a third control signal CD decoded by the column address 17 via a third control line (13). The potential difference between a data line pair 14 is amplified by turning-on the differential amplifier 4 by feeding a fourth control signal SE via a fourth control line 10. Subsequently, the signal of the amplified potential difference is further amplified by plural-stage amplifiers 4 to be finally output through an output buffer 11.

It is noted here that a write operation is performed using a write bus 15, which goes a high-impedance state in a read operation and which outputs write data in a write operation. In a write operation, the discrimination signal CEWE on the signal line (8) goes high so that the clamping signal FF on the second control line (18) also goes high, causing the clamping operation to be released in a D.C. manner. Since the writing circuit is not so related to the circuit of the present invention, its detailed description is omitted here.

As a background of introducing the conventional technique in the field, high integration of SRAMs has involved an increasing number of memory cells 5 to be connected to the bit line pair 3 s that the floating capacity of the bit line pair 3 would drastically increase, resulting in that the equalizing operation takes much time to perform a read operation. Therefore, the delay time for reading operation will increase. By this reason, the technique has been introduced with a view of reducing the delay time for the equalizing operation by suppressing the amplitude of the data signal on the bit line 3, that is, by clamping the potential difference between the bit line pair 3.

However, the clamping operation, as stated above, is carried out in such a manner that the amplitude of the potential difference between the bit line pair 3 is suppressed by making a current flow in DC through the bit line 3 using the clamping circuit consisting of the transistors 1a and 1b. Therefore, immediately after the voltage data of the memory cell 5 is read out to the bit line pair 3 by turning on the level of the word line 9, the read-out voltage data on the bit line pair 3 disadvantageously results in a small one due to the effect of the clamping operation.

Therefore, in a conventional method as shown in FIGS. 14 to 16, there has been proposed as a solution of the problem in the Reference Literature 1 (Miyaji et al. "A 25 ns 4Mb CMOS SRAM with Dynamic Bitline Loads" ISSCC89 Digest of Technical Papers pp. 250-251, February 1989): in this method the clamping operation is released for a period during which the data stored in the memory cell 5 is read out to the bit line pair 3 by turning on the word line 9 thereby to efficiently generate a potential difference between the bit line pair 3 and thereafter the clamping operation is started.

In the conventional reading circuit, however, the timing of starting the release of the clamping operation coincides with a time point at which the equalizing operation is ended by controlling the equalizing signal ATD on the first control line 6. So if the word line 9 is turned on to read out the data of the memory cell 5 to the bit line pair 3 at a time point earlier than the time point at which the equalizing operation is ended, the read-out operation is started while remaining the clamping operation unreleased and the potential to be read to the bit line 3 would be necessarily influenced by the effect of the clamping operation as well as that of the equalizing operation. This causes the readout voltage to be suppressed, resulting in difficulties in obtaining stable, high-speed read operations.

Moreover, even with an enough potential difference obtained on the bit line 3 by releasing the clamping operation, if the timing of turning on the subsequent amplifier 4 is delayed, the clamping operation might start before starting the reading operation so that the obtained potential difference would be made smaller before turning on the amplifier 4, leading to a difficulty in obtaining a stable read operation.

Yet further, the input of the differential amplifier 4 in the first stage is obtained only by the potential difference that develops to the bit line pair 3 only by reading out the data stored in the memory cell 5, and therefore the resulting amplification speed of this potential difference is of low level, and the amplification speed of the output of the amplifier 4 also becomes slow. Thus, to implement a further high-speed read operation, it is necessary to connect a positive-feedback type amplifier to the input of the differential amplifier 4. However, in the arrangement in which the bit line 3 is connected to the input of the differential amplifier 4, such an added positive-feedback type amplifier involves so heavy a load that a high-speed amplification cannot be obtained and moreover it results in an increased current consumption.

SUMMARY OF THE INVENTION

The present invention has been achieved in view of the above-described problems and its essential object is to provide a reading circuit for a semiconductor memory such as an SRAM or a DRAM, which has been improved to offer large-scale capacities and high-speed operations and yet which has been enhanced in the reliability of its stable operations.

In order to solve the problems mentioned above, the present invention provides a reading circuit for a semiconductor memory in which, nearly concurrently with start of an operation of precharging a bit line pair to a first voltage supply source, clamping of the bit line pair is released while the bit line pair is connected to an input portion of a differential amplifier, the reading circuit comprises: equalizing means consisting of first, second and third switch means, wherein the first and second switch means are interposed for connecting the first voltage supply source to the bit line pair respectively, and the third switch means is connected across the bit line pair for short-circuiting the bit line pair; clamping means consisting of fourth and fifth switch means which are interposed for connecting the bit line pair to the first voltage supply source respectively; and sixth and seventh switch means for connecting the bit line pair to the input portion of the differential amplifier, wherein the equalizing means is controlled by a first control line, and the clamping means is controlled by a second control line, and the sixth and seventh switch means are controlled by a third control line, and wherein the first control line turns on the equalizing means during a period of a first pulse width (ATD) fed via the first control line, and the third control line turns on the sixth and seventh switch means nearly concurrently when the equalizing means is turned on, and the third control line turns off the same after an elapse of a specified period, and the second control line turns on the clamping means for a period nearly equal to the duration during which the sixth and seventh switch means are held off.

The present invention is characterized in that, a second amplifier of a positive feedback type to be controlled by the fourth control line is connected to the input portion of the differential amplifier, the fourth control line turning on the second amplifier for a period during which the sixth and seventh switch means are held off.

The present invention is further characterized in that, the first voltage supply source is connected to the bit line pair by way of the first and second switch means respectively, and the bit line pair is short-circuited by an eighth switch means as well as by the third switch means, and the eighth switch means is controlled by the second control line. The equalizing means is constructed only by the third switch means.

The present invention is furthermore characterized in that, a second voltage supply source is connected to the bit line pair by way of the first and second switch means respectively, and the bit line pair is further connected to a third voltage supply source by way of the fourth and fifth switch means respectively, wherein the voltage of which is lower than that of the second voltage supply source.

With the above-described arrangement of the present invention, nearly concurrently with start of the operation of precharging the bit line pair to the first supply voltage by the first control line, the clamping of the bit line is released by the second control line, and the bit line is further connected to the input of the differential amplifier by the third control line. Accordingly, if the word line turns on in the course during which the word line precharges the bit line, the clamping operation has already been released, allowing an easy generation of a potential difference as compared to the conventional circuit, and allowing the timing of the turning-on of the succeeding-stage amplifier to be made earlier accordingly. Thus, it is made feasible to make the reading operation higher in speed and greater in stability.

It is also arranged that, to restart the clamping operation after effecting the release of the clamping operation, the bit line pair to be clamped by the third control line is disconnected from the input of the differential amplifier. Thus, even if the timing for turning on the differential amplifier is delayed to start the clamping operation, the input voltage of the differential amplifier is free from any effect of the clamping operation, so that stable readout operation can be performed consequently.

According to another feature of the invention, the potential difference of the input of the differential amplifier that has been made smaller in load capacity by being disconnected from the bit line pair can be amplified by a positive-feedback type amplifier at high speed. Thus the output of the differential amplifier is also amplified at high speed, allowing a high-speed reading operation.

According to further another feature of the invention, by holding the equalizing operation on even during the period of clamping operation, the clamping operation can be done at a small potential difference in the vicinity of a first source potential, allowing the equalizing operation after address transition to be relieved. This means that the size of precharge transistors and equalizing transistors to be turned o after address transition can be reduced, allowing a highspeed reading operation at low power consumption eventually.

According to further another feature of the invention, the equalizing operation after address transition is implemented only by equalizing transistors with precharge transistors removed. Thus the transistors to be charged and discharged can be reduced in number, allowing a high-speed reading operation at low power consumption eventually.

According to further another feature of the invention, the equalizing operation for only a short period subsequent to address transition is effected at high speed by the second supply voltage having a high potential while the clamping operation in a DC manner is effected by using a third supply voltage lower than the second supply voltage that assures memory cells in terms of reliability. This allows a high-speed, stable reading operation.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE PREFERRED EMBODIMENTS

Embodiment 1

Figure 1:
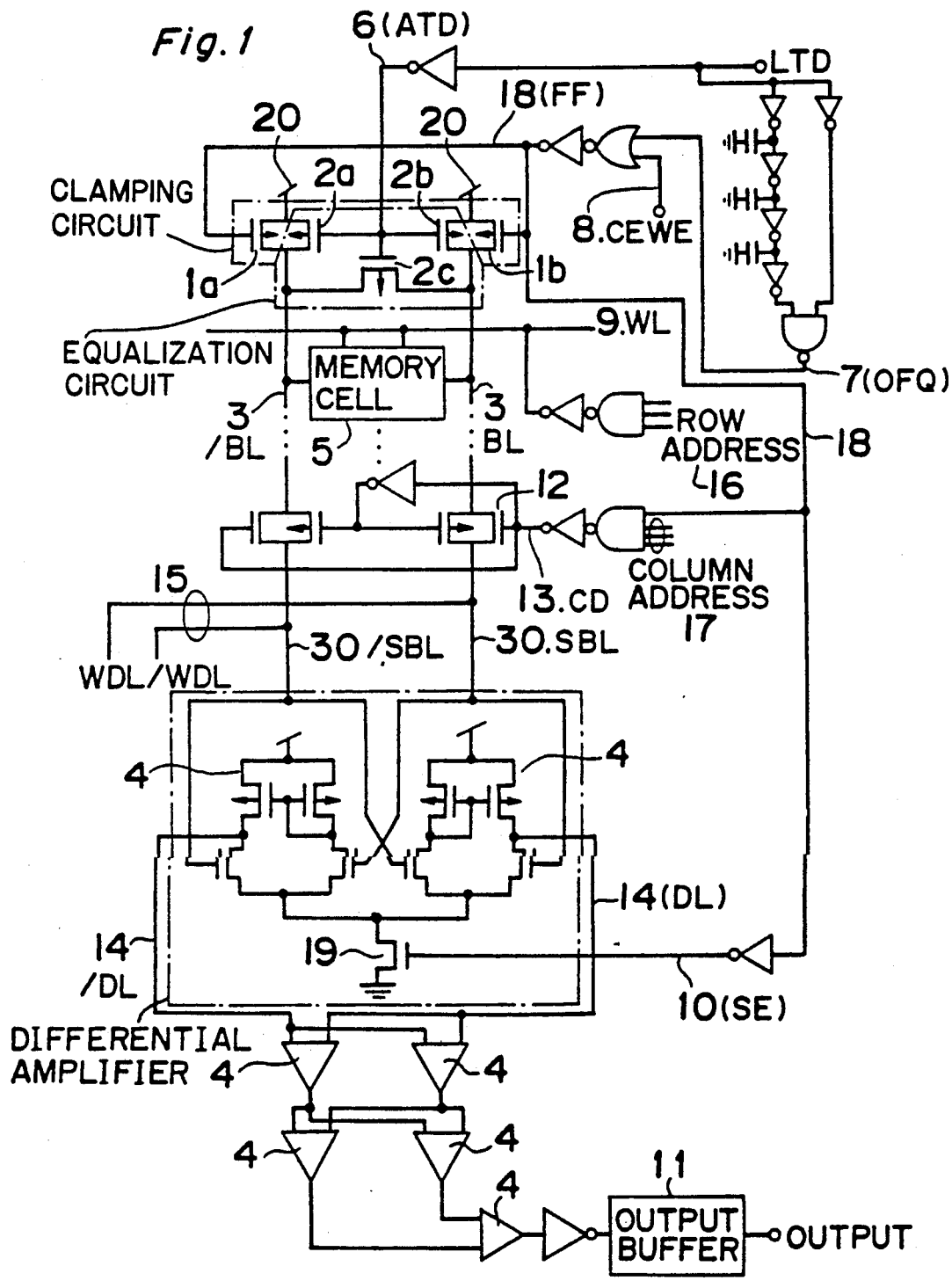
FIG. 1 is a circuit diagram showing a first embodiment of a reading circuit for an SRAM according to the present invention.
Figure 2:
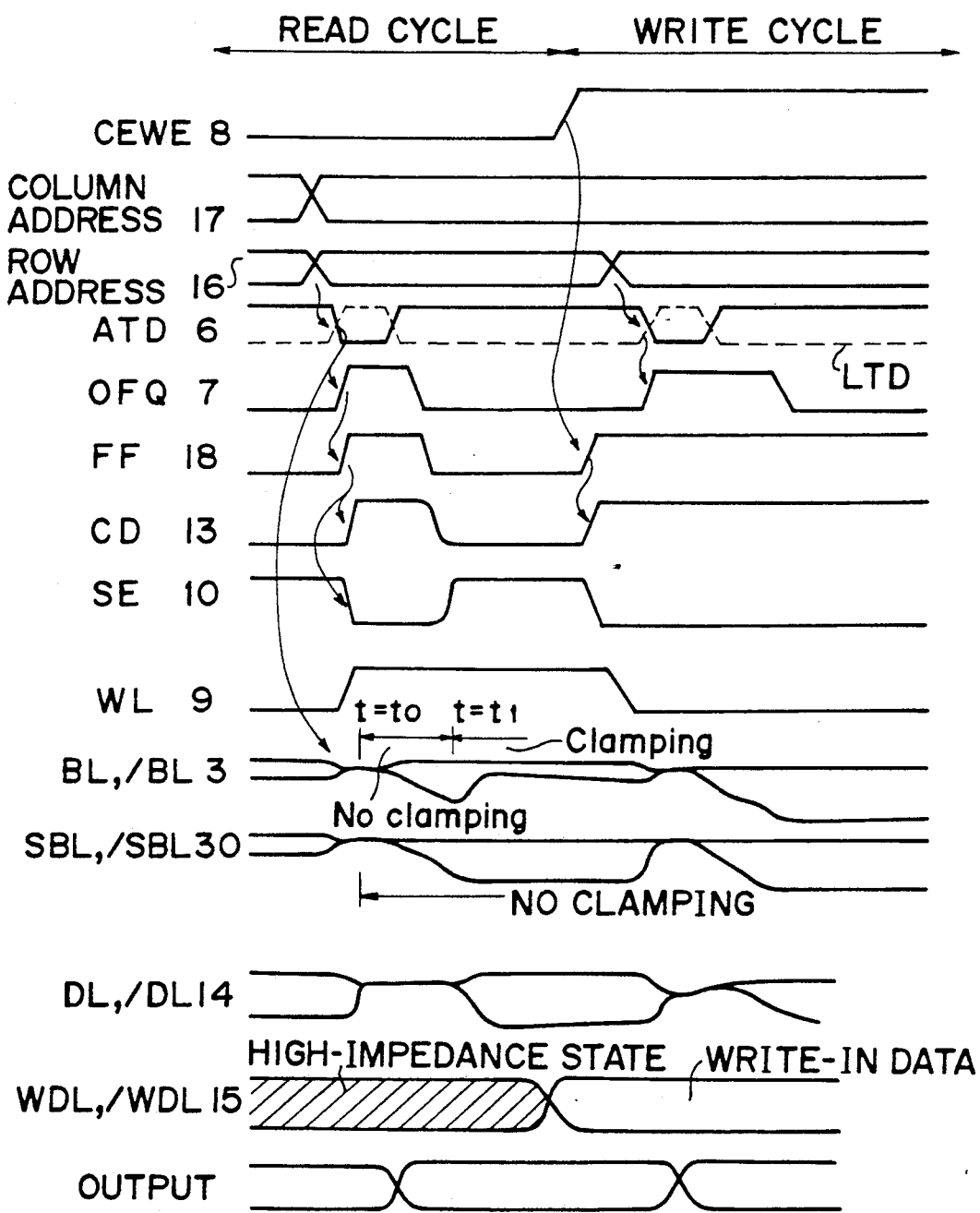
FIG. 2 is a view for explaining the operation of the reading circuit of the same embodiment.
Figure 3:
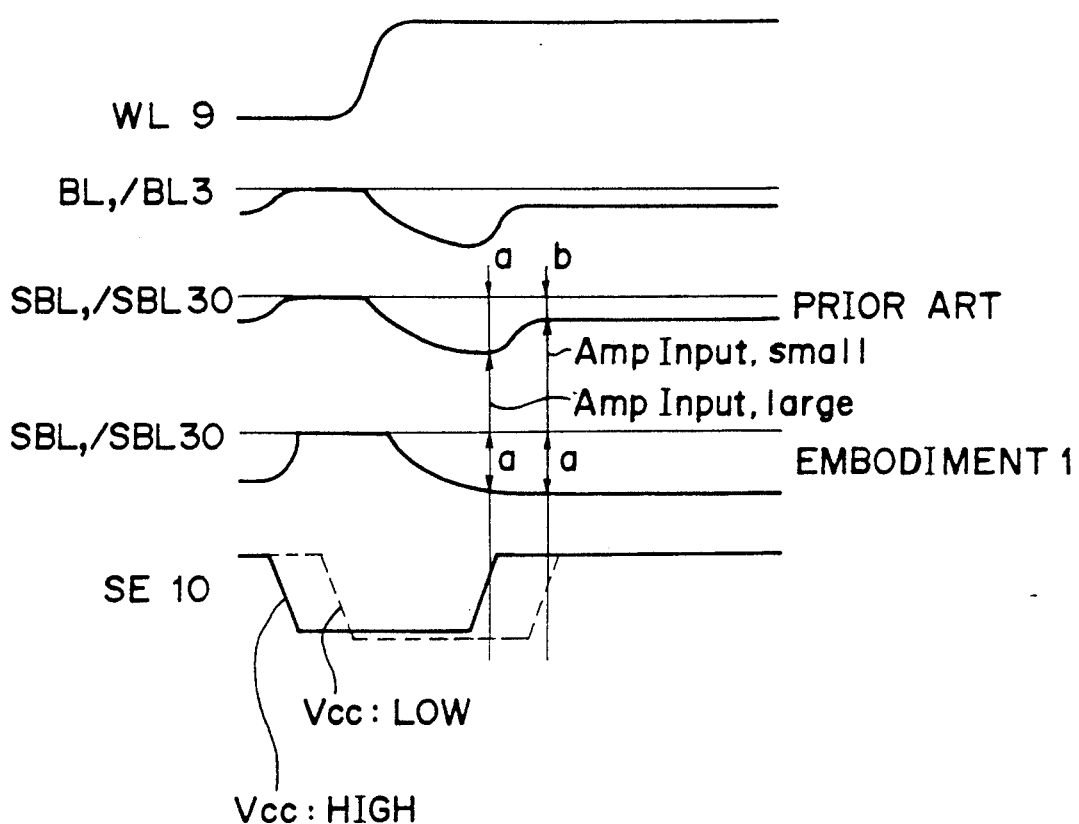
FIG. 3 is a view for explaining the operation of the same embodiment in comparison with the conventional one.

A first embodiment of the present invention is now described with reference to FIGS. 1, 2, and 3. FIG. 1 shows a reading circuit for an SRAM according to the first embodiment of the invention. FIG. 2 shows a view for explaining the operation of the circuit shown in FIG. 1. FIG. 3 shows a view for explaining the reading operation in comparison between the first embodiment of the present invention and the conventional one.

Figure 14:
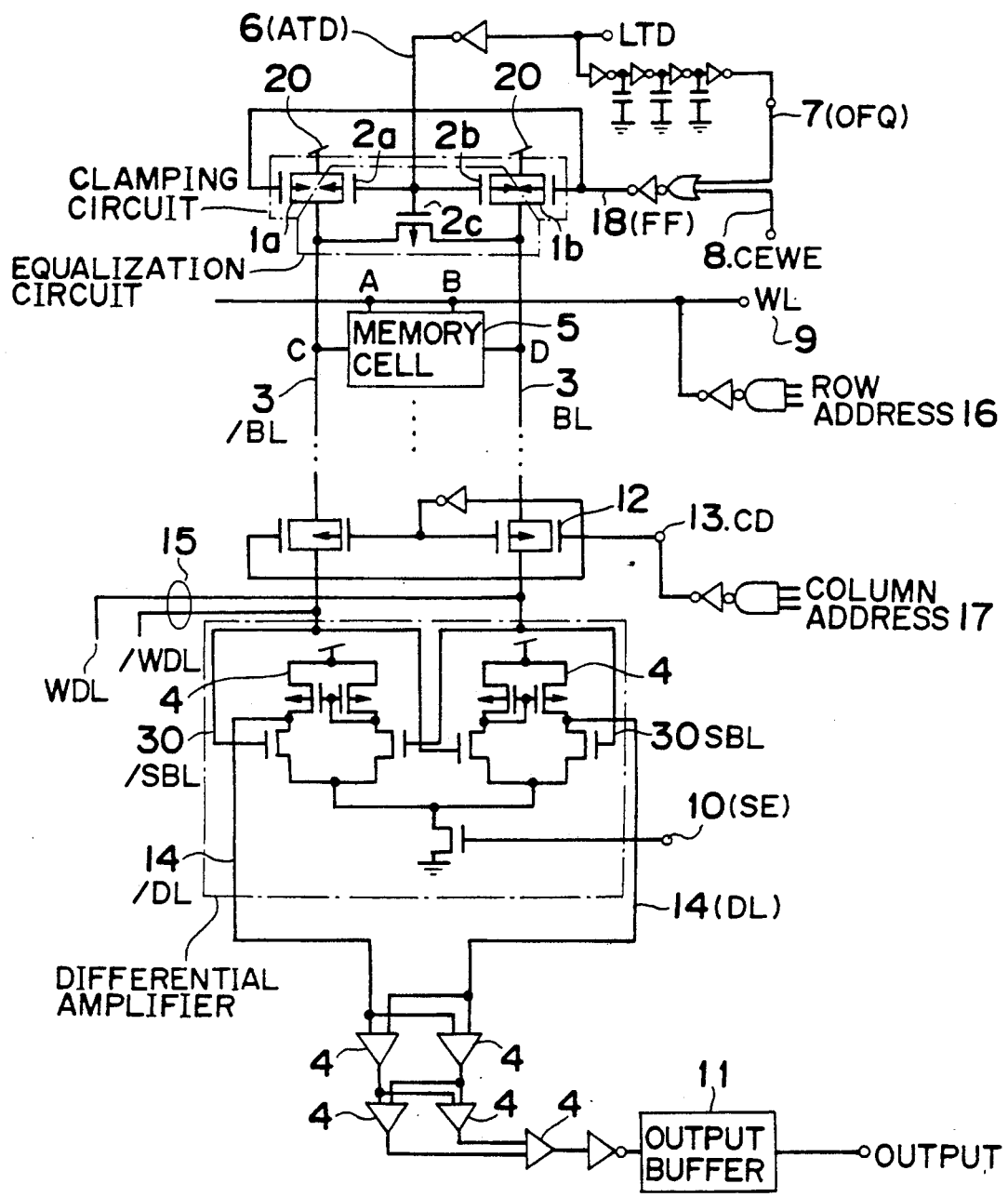
FIG. 14 is a circuit diagram showing a conventional reading circuit.
Figure 15:
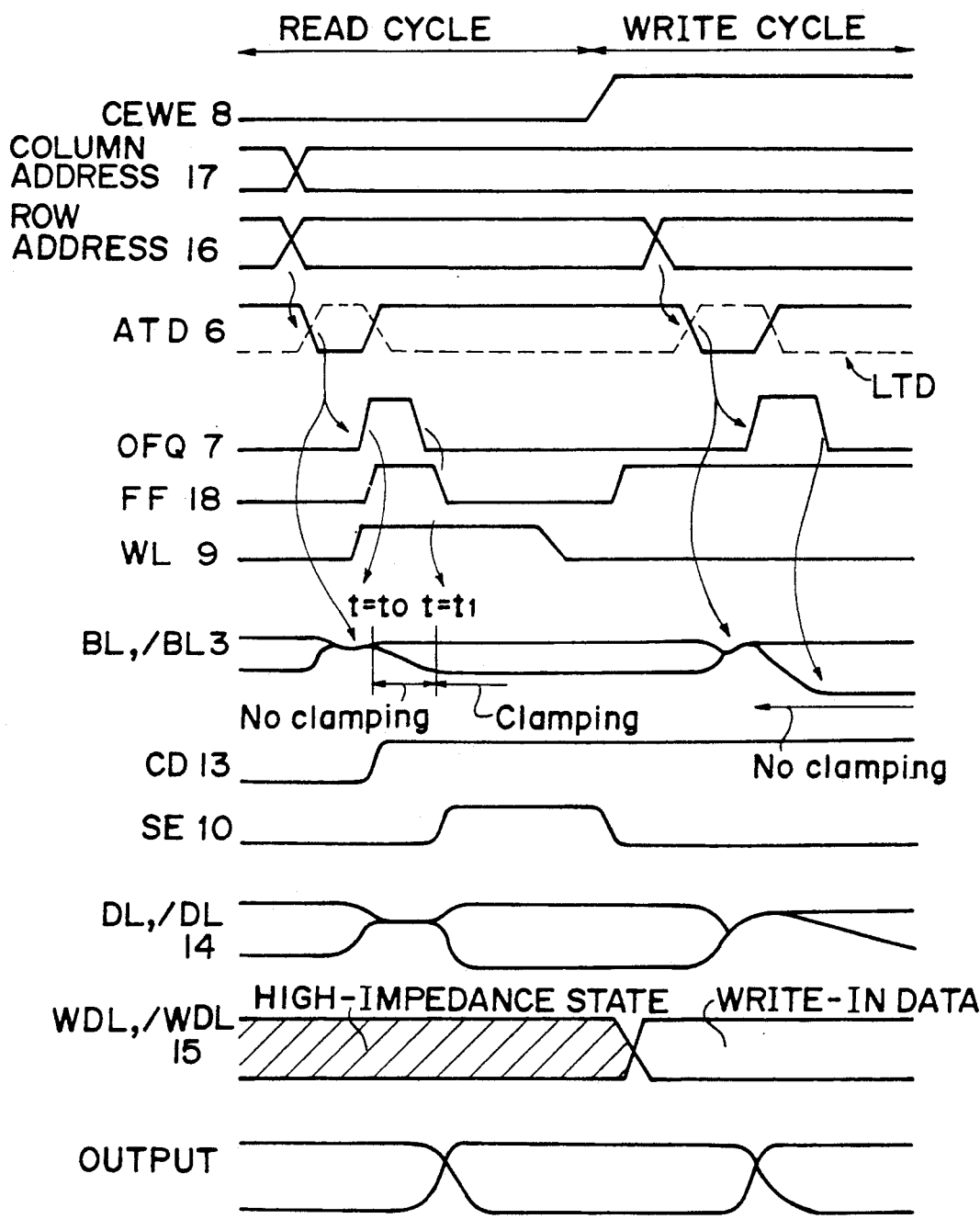
FIG. 15 is a view for explaining the operation of the same conventional one.
Figure 16A:
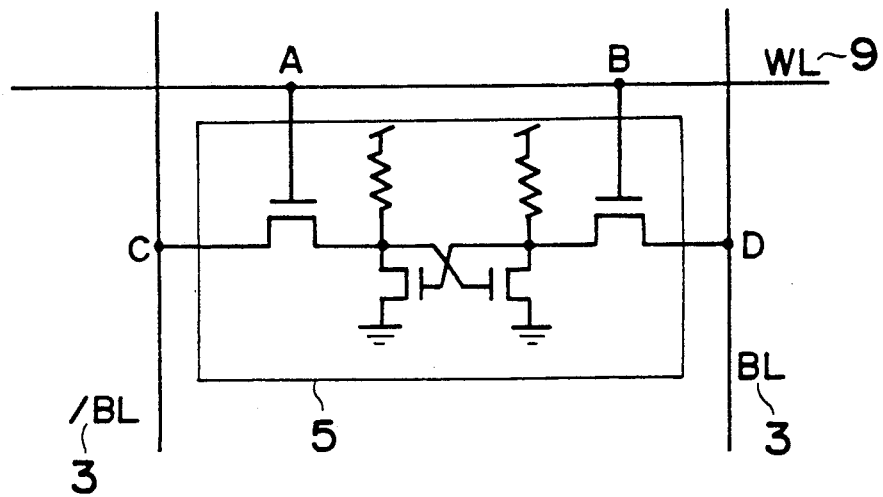
FIGS. 16(a) and 16(b) are views for explaining memory cells of an SRAM.
Figure 16B:
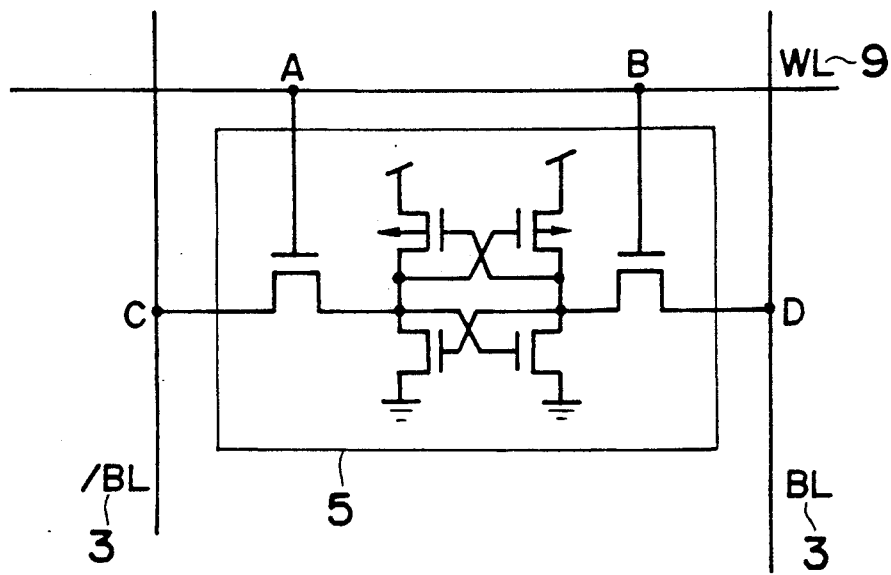

The basic arrangement of the circuit of the present invention is the same as the conventional circuit shown in FIGS. 14 through 16. For simplicity, like parts are indicated by like numerals throughout the following description, their detailed explanation being omitted.

The present embodiment is, in brief, so arranged that the connection between a complementary bit line pair (BL, /BL) 3 and a sub-bit line pair (SBL, /SBL) 30 serving as an input terminal of a differential amplifier 4 is controlled using an address transition detection signal LTD, wherein when the bit line pair 3 is equalized in pulse after address transition, the bit line pair 3 and the sub-bit line pair 30 serving as the input terminal of the differential amplifier 4 are connected in pulse to each other for a little longer period than the equalizing period, and when the bit line pair 3 is in a clamping operation, the bit line pair 3 is disconnected from the input terminal 30 of the differential amplifier 4, thereby allowing the reading circuit to effect a high-speed, stable reading operation.

The reading circuit as shown in FIG. 1 is now described with reference to the operation explanatory view of FIG. 2. An equalizing circuit made up of first, second, and third transistors 2a, 2b, and 2c serves to precharge and equalize a bit line pair 3 with respect to a first supply voltage 20 using an equalizing signal ATD fed via a first control line 6. The equalizing signal ATD is obtained by inverting a transition detection signal LTD (indicated by broken line in FIG. 2) for detecting transition of a column address 17 or a row address 16. The transition detection signal LTD, i.e., the equalizing signal ATD is generally generated by detecting a change of an external address, and the pulse width of the equalizing signal ATD is previously set to a period a little longer than the period for equalizing the bit line pair 3.

Meanwhile, although in the conventional clamping circuit there is used merely a delay signal OFQ of the LTD signal, in a clamping circuit made up of fourth and fifth transistors 1a and 1b of the present embodiment there is generated a signal OFQ on the signal line 7 having a pulse width extended by a few nanoseconds over that of the LTD signal in the present invention, and the clamping circuit (1a, 1b) is turned off to release the clamping of the bit line pair 3 for a period from t=t0 to t=t1 when the equalizing operation is started by the equalizing circuit (2a, 2b, 2c). The equalizing circuit is controlled by an equalizing signal FF fed via a second control line 18 which represents an OR relation between the generated OFQ signal on the line 7 and a discrimination signal CEWE. The discrimination signal CEWE is fed via a signal line 8 for discriminating whether a write cycle or a read cycle is in operation. The data signal stored in the memory cell 5 is read out to the complimentary bit line pair 3 by controlling the signal level on the word line 9.

By this arrangement, the clamping operation can be prevented during a time period in which the data signal read out of the memory cell 5 to the bit line 3 is not great enough.

The potential difference of the bit line pair 3 is further transferred to the succeeding stage by connecting in pulse between the bit line pair 3 and a sub-bit line pair (SBL, /SBL) 30 serving as an input of a succeeding-stage differential amplifier 4. The connection in pulse between the bit line pair 3 and the sub-bit line pair 30 is effected by controlling the level of the third control signal CD fed via a third control line 13 under control of a decoding signal fed by the column address 17 and the decoded second control signal FF fed via the second control line 18. That is, one end of the third control line 13 is connected to the second control line 18 through an inverter and an AND gate while the other end of the line 13 is also connected to a transistor 12 which serves as a switch means. The switch means 12 is turned off when the bit line pair 3 is clamped, and is turned on when the clamping operation is released. The data of the potential difference between the bit line pair 3 is transmitted to the input terminal 30 of the differential amplifier 4 when in the time period in which the first and second control lines 6 and 18 are in OFF state while the third control line 13 is in ON state.

That is, the first control line 6 turns on the equalizing circuit consisting of first, second and third switching transistors 2a, 2b and 2c during a period of a first pulse width (ATD) fed via the first control line 6. The third control line 13 turns on the sixth and seventh switching transistors (12, 12) nearly concurrently when the first, second and third switching transistors 2a, 2band 2c are turned on, and the third control line 13 turns off the same after an elapse of a specified period. The second control line 18 turns on the fourth and fifth switching transistors 1a and 1b constructing the clamping circuit for a period nearly equal to the duration during which the sixth and seventh switching transistors (12, 12) are held off.

The potential difference between a data line pair (DL, /DL) 14 is amplified by turning on the differential amplifier 4 by controlling a fourth control line (SE) 10 which is connected to the second control line 18 via an inverter. The potential difference between the data line pair 14 is subsequently amplified by plural-stage amplifiers 4 of later stages to be finally output through an output buffer 11.

It is noted here that, a write operation is performed using a write bus 15, which goes a high-impedance state in a read operation and which outputs write data in a write operation. In a write operation, the write/read discriminating signal CEWE fed by the line (8) goes in a high level so that the clamping signal FF on the second control line 18 also goes high, thereby causing the clamping operation to be released in a DC manner. The writing circuit is not so related to the reading circuit of the invention, being omitted in its detailed description.

Referring next to FIG. 3, effects of the present embodiment are described in comparison with the conventional ones.

First, the word line (WL) 9 is selected and the data of potential difference stored in the memory cell 5 is read out to the bit line pair 3. When there develops a potential difference a enough to be stably detected by a succeeding-stage amplifier 4, the amplifier 4 is turned on using the fourth control line (SE) 10. In the conventional circuit, if the timing of turning on the amplificr 4 is delayed by fluctuation of device characteristics due to temperature or supply voltage, the clamping operation would start before the differential amplifier 4 is activated. In the conventional circuit, in this case, the obtained potential difference would decrease from a to b as shown in FIG. 3 so that the succeeding-stage amplifier would not operate with stability.

By contrast, in the circuit of the present invention, by controlling the third control line 13 connected to the second control line 18, the bit line pair 3 and the input terminal 30 of the amplifier 4 will be disconnected from each other when the clamping operation is started, so that the potential difference of the input terminal 30 of the succeeding-stage amplifier 4 will not decrease, allowing the stable operation of the succeeding stage amplifier 4.

In addition, although it has been arranged in this embodiment in such a manner that, when the bit line pair 3 is equalized in pulse by the equalizing circuit after address transition, the bit line pair 3 and the input terminal 30 of the differential amplifier 4 are connected in pulse to each other for a time period little longer than the equalizing period, yet in such a case or another as when a normal potential difference develops to the bit line pair 3 even during the equalizing period owing to a large reading current capability of the memory cell 5, the bit line pair 3 and the input terminal 30 of the differential amplifier 4 may be connected to each other in pulse during the same period as the equalizing period.

Embodiment 2

Figure 4:
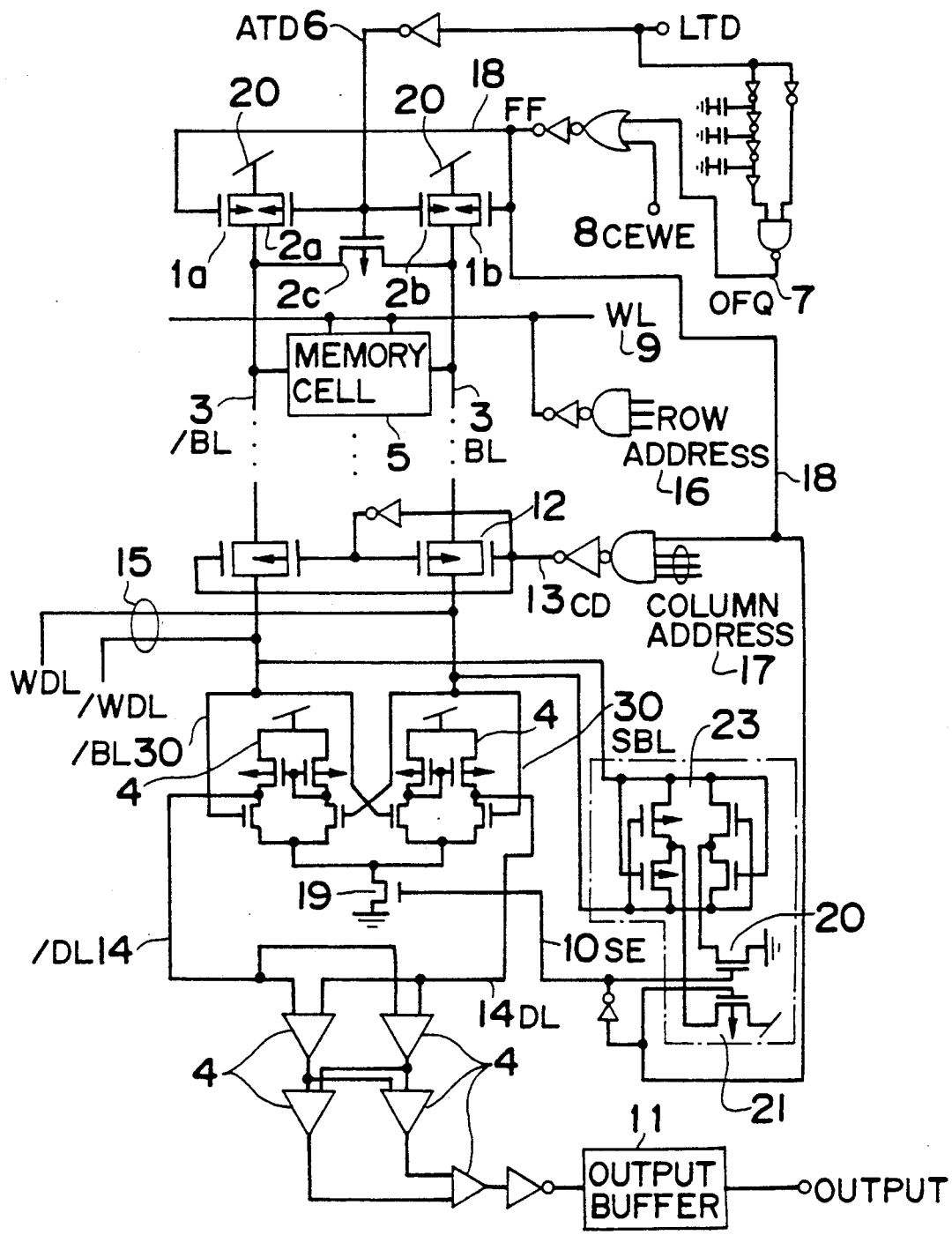
FIG. 4 is a circuit diagram showing a second embodiment of a reading circuit according to the present invention.
Figure 5:
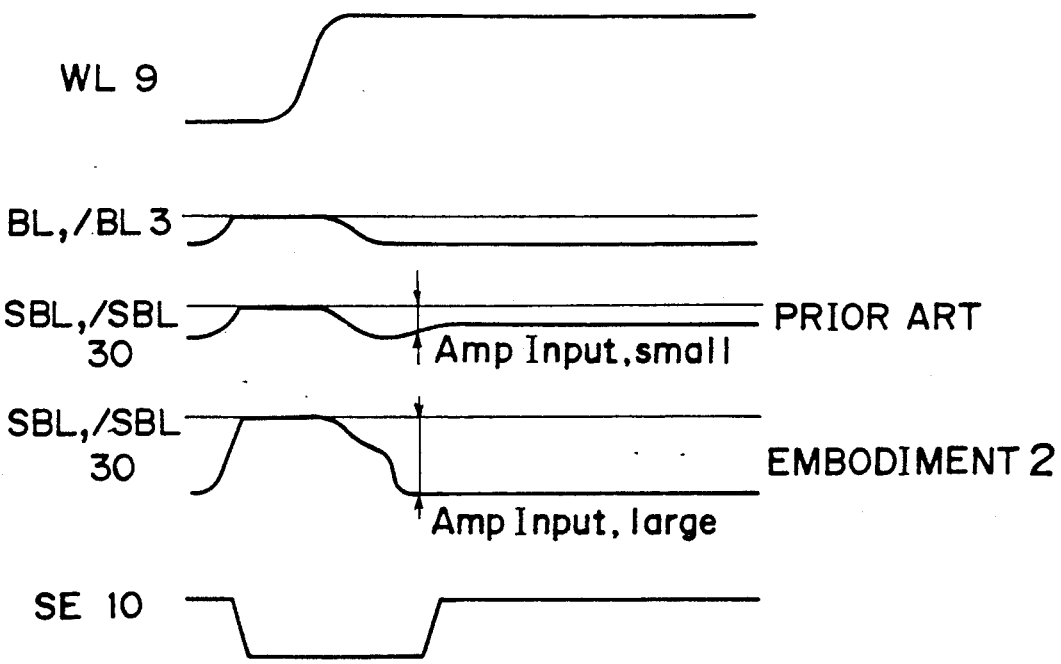
FIG. 5 is a view for explaining the operation of the same embodiment in comparison with its prior art.

Next, a second embodiment of the present invention is described with reference to FIGS. 4 and 5. FIG. 4 shows a reading circuit according to the second embodiment of the invention. FIG. 5 shows an explanatory view of the reading operation in comparison between the second embodiment of the invention and the conventional circuit.

The basic arrangement of this circuit is the same as that of the first embodiment as shown in FIGS. 1 and 2. For simplicity, like parts are indicated by like numerals throughout the following description, their detailed explanation being omitted.

The present embodiment of the invention is, in brief, a modification of the circuit of the first embodiment, wherein the sub-bit line pair (SBL, /SBL) 30 serving as the input terminal of the differential amplifier 4 separated from the bit line 3 is amplified at high speed by incorporating a positive feedback amplifier 23 which is a CMOS latch type sensing amplifier.

The reading circuit of FIG. 4 is now described with reference to the operation comparative view of FIG. 5.

A potential difference is read out of the memory cell 5 to the bit line pair 3 by selecting a word line 9 and the read-out potential difference is transferred to the succeeding stage by connecting in pulse between the bit line pair 3 and the sub-bit line pair 30 serving as the input terminal of the succeeding-stage differential amplifier 4 by controlling a third control line (CD) 13 using a decoding signal fed by a column address 17 and an equalizing signal FF fed by a second control line 18. The potential difference between a data line pair (DL, /DL) 14 is amplified by turning on a fourth control line (SE) 10 which is connected to the differential amplifier 4 by way of a transistor 19. The fourth control line (SE) 10 is controlled by connecting to the second control line (FF) 18 through an inverter.

However, the conventional circuit encounters some problems as well as those described before, that is, the amplification speed of a potential difference that develops to the bit line pair 3 is so low due to a great capacity of the bit line 3 that the amplification speed of the succeeding-stage differential amplifier 4 is lowered.

By contrast, the present embodiment has such an arrangement that the bit line pair 3 of great capacity and the input terminal 30 of the differential amplifier 4 are disconnected from each other, whereby the input terminal 30 of the differential amplifier 4 that has been relieved in load capacity to an extremely small one can be amplified at high speed by incorporating the positive-feedback amplifier 23 which is a CMOS latch type sensing amplifier including transistors 20 and 21, with the resulting possibility to increase the amplification speed of the differential amplifier 4. That is, the second amplifier of flip-flop type to be controlled by the fourth control line 10 is connected to the input portion of the differential amplifier 4, and the fourth control line 10 turns on the second amplifier 23 for a period during which the sixth and seventh switching transistors (12, 12) are held off.

Embodiment 3

Figure 6:
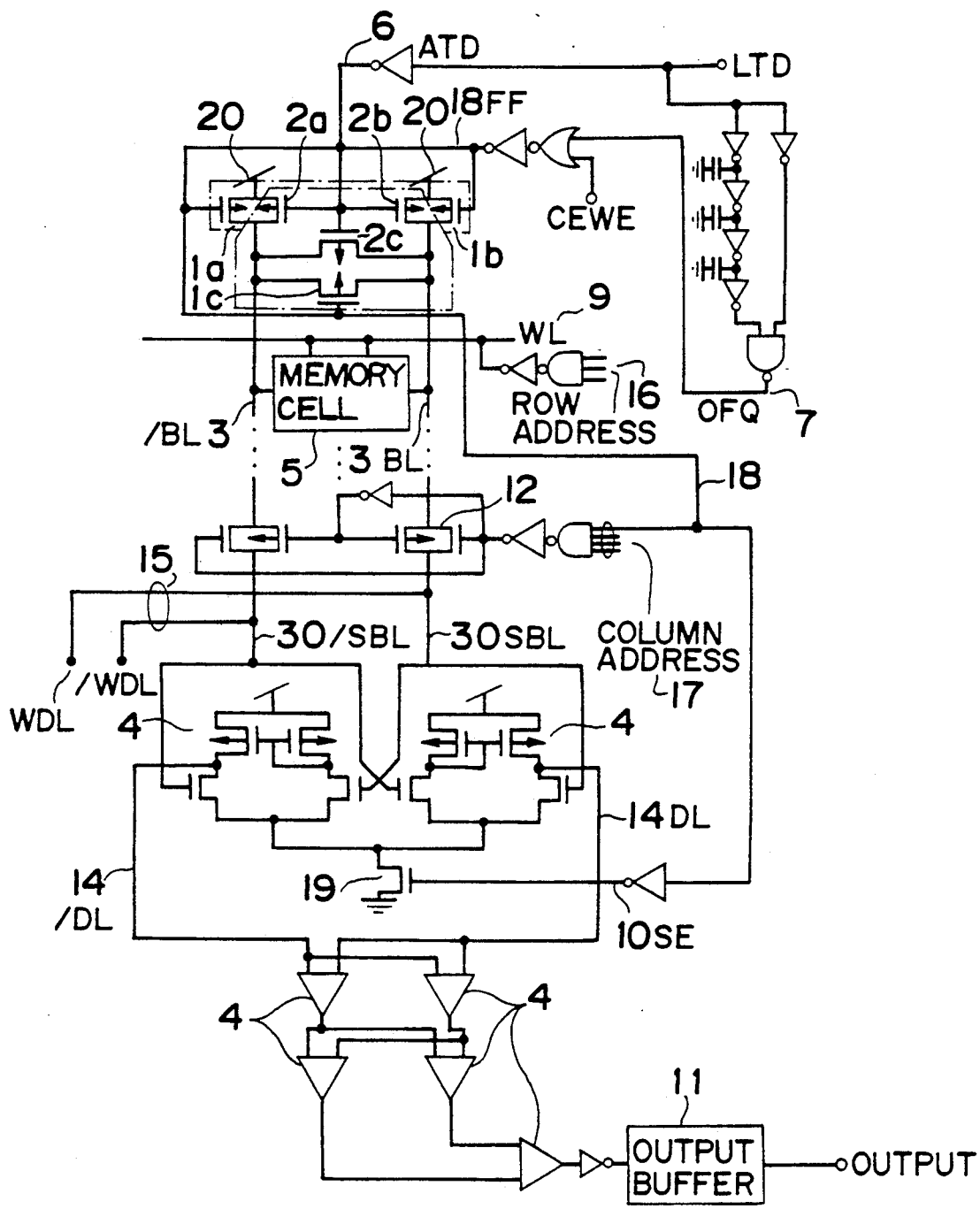
FIG. 6 is a circuit diagram showing a third embodiment of a reading circuit according to the present invention.
Figure 7:
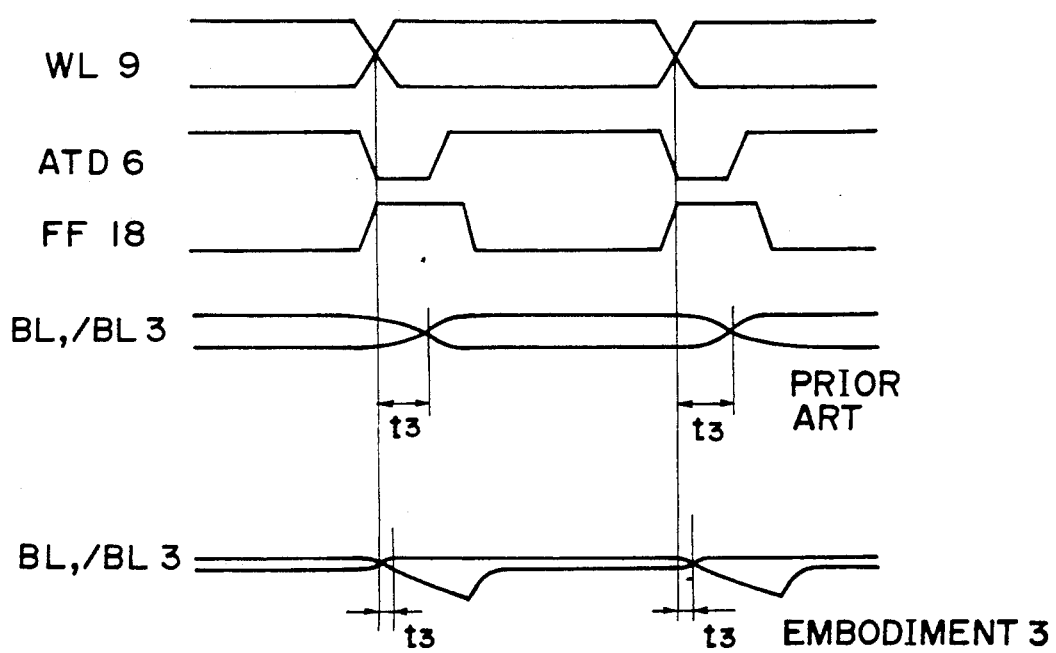
FIG. 7 is a view for explaining the operation of the same embodiment in comparison with its prior art.

Next a third embodiment of the present invention is described with reference to FIGS. 6 and 7. FIG. 6 is a circuit diagram of a reading circuit according to the third embodiment of the invention. FIG. 7 is a view for explaining the reading operation in comparison between the third embodiment of the invention and its prior art.

The basic arrangement of the reading circuit is the same as that of the first embodiment as shown in FIGS. 1 and 2. For simplicity, like parts are indicated by like numerals throughout the following description, their detailed explanation being omitted.

The present embodiment of the invention is, in brief, a modification of the reading circuit of the first embodiment: whereas in the first embodiment the clamping circuit is made up of the transistors 1a and 1b to be controlled by the second control line (FF) 18, here is added a transistor 1c for exerting a function of equalization so that the clamping operation can be held even with a smaller potential difference, with a view to reducing the reading time including a subsequent equalizing operation time.

The reading circuit shown in FIG. 6 is now described with reference to the operation comparative view of FIG. 7.

A word line 9 is newly selected with a change in the row address 16, and there is once equalized a potential difference between the bit line pair 3 which depends on the data read out of the memory cell 5 connected with the word line 9 that had previously been selected, and thereafter substituted by a new potential difference with the data of the memory cell 5 that is newly connected to the bit line pair 3. The transition time (t3) for this sequence of bit line potential difference involves a delay when the data of the memory cell 5 newly connected is inverse to the data of the memory cell 5 that had previously been connected, in which case the potential difference of the bit line pair 3 should b inverted in its potential difference. The delay time increases as the potential difference in the clamping operation increases.

However, to reduce the potential difference in the clamping operation without using the equalizing transistor 1c, it is necessary to increase the size of the transistors 1a and 1b. In this embodiment, by employing the transistor 1c even for the period of clamping operation, it is made possible to hold a small potential difference without requiring the transistors 1a and 1b to be increased in size, allowing the transition time of the bit line pair 3 for a subsequent reading operation to be reduced.

Embodiment 4

Figure 8:
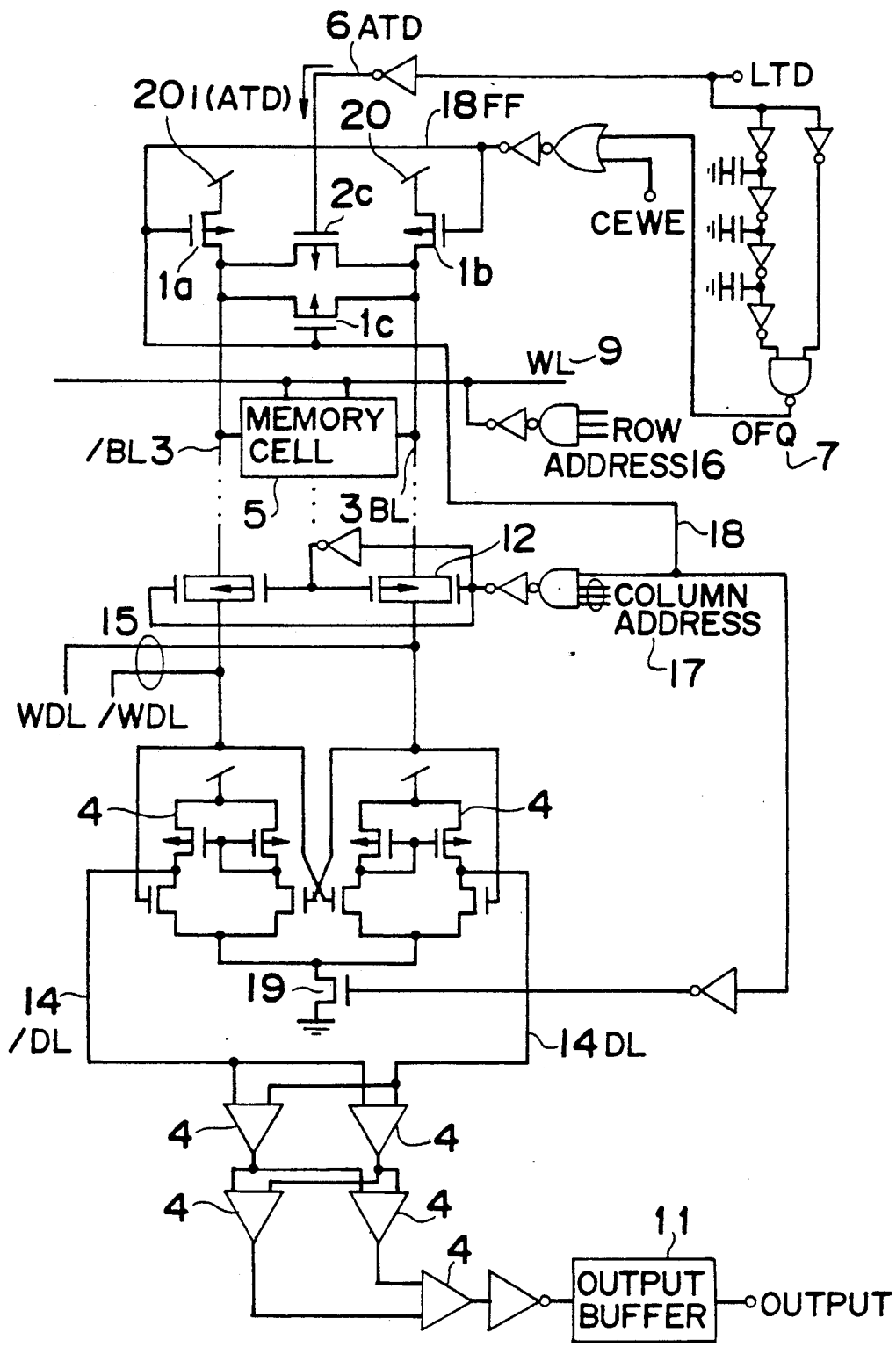
FIG. 8 is a circuit diagram showing a fourth embodiment of a reading circuit according to the present invention.
Figure 9:
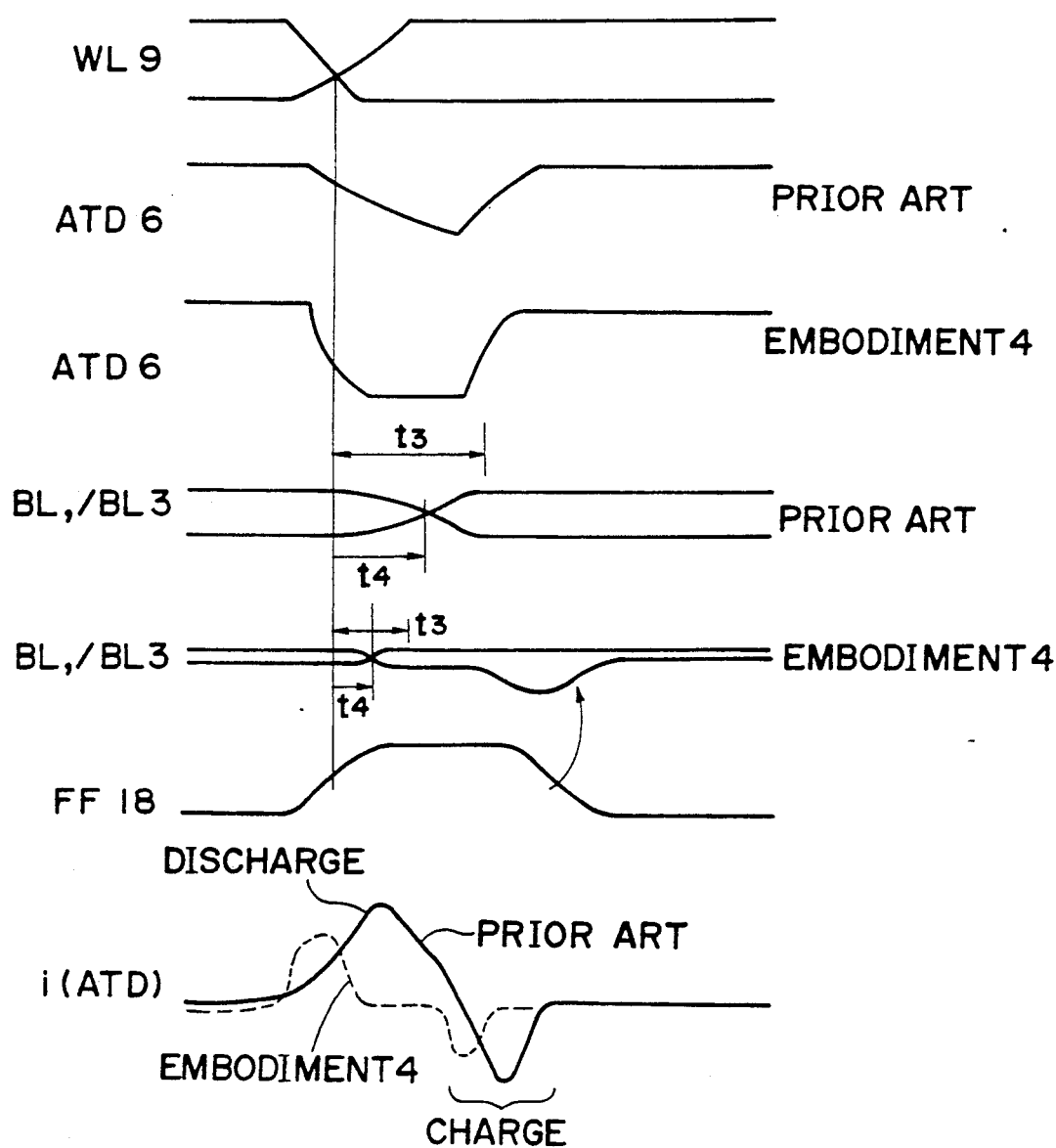
FIG. 9 is a view for explaining the operation of the same embodiment in comparison with its prior art.

Next a fourth embodiment of the present invention is described with reference to FIGS. 8 and 9. FIG. 8 shows a reading circuit according to the fourth embodiment of the invention. FIG. 9 shows a view for explaining the reading operation in comparison with the fourth embodiment of the invention and the conventional one. The basic arrangement of the fourth embodiment is the same as the first embodiment as shown in FIGS. 1 and 2. For simplicity, like parts are indicated by like numerals throughout the following description, their detailed explanation being omitted.

In the reading circuit of the first embodiment, the clamping circuit was made up of the transistors 1a and 1b to be controlled by the second control line (FF) 18, whereas in the third embodiment the transistor 1c has been added which serves the function of equalization so that the clamping operation can be held even with a smaller potential difference so that the equalization circuit has been implemented by three transistors 2a, 2b, and 2c.

In this fourth embodiment, however, only one transistor 1c is employed so as to reduce the load capacity of the first control line (ATD) 6, with a view to realizing a high-speed operation of the first control line (ATD) 6 reduced in load capacity and moreover realizing a high-speed reading operation eventually.

The reading circuit shown in FIG. 8 is now described with reference to the operation comparative view of FIG. 9.

A word line 9 is newly selected with a change in the row address 16, and there is once equalized a potential difference which depends on the data read out of the memory cell 5 connected with the word line 9 which had previously been selected. Thereafter the potential difference is substituted by a new potential difference with the data of the memory cell 5 that is newly connected to the bit line pair 3. The transition time (t3) for this sequence of bit line potential difference involves a delay when the data of the memory cell 5 newly connected is inverse to the data of the memory cell 5 that had previously been connected, in which case the potential difference of the bit line pair 3 should be inverted in its potential difference.

The delay time increases as the potential difference between the bit line pair 3 in the clamping operation decreases and as the equalization is more insufficient. However, with a great load capacity to be driven by the first control line (ATD) 6, the trailing edge of the pulse signal ATD on the line 6 may be dulled such that the starting of the equalizing operation is delayed. This means that t4 as shown in FIG. 9 is extended too large.

Therefore, the present embodiment incorporates an equalizing transistor 1c to be used in the clamping period, thereby allowing a small potential difference to be held, where it is made possible to implement the equalizing operation immediately after address transition only with the equalizing transistor 2c.

Moreover it has also been made possible to reduce the load capacity to be driven by the pulse signal ATD on the first control line 6, thereby to start the equalizing operation at high speed without dulling the trailing edge of the ATD signal. Eventually, it is made possible to allow a high-speed reading operation with a reduced delay tim of the delay times t3 and t4. Decrease in the load capacity to be driven by the ATD signal is naturally accompanied by decrease in current i (ATD) to be charged and discharged, contributing to decrease in the operating current.

Embodiment 5

Figure 10:
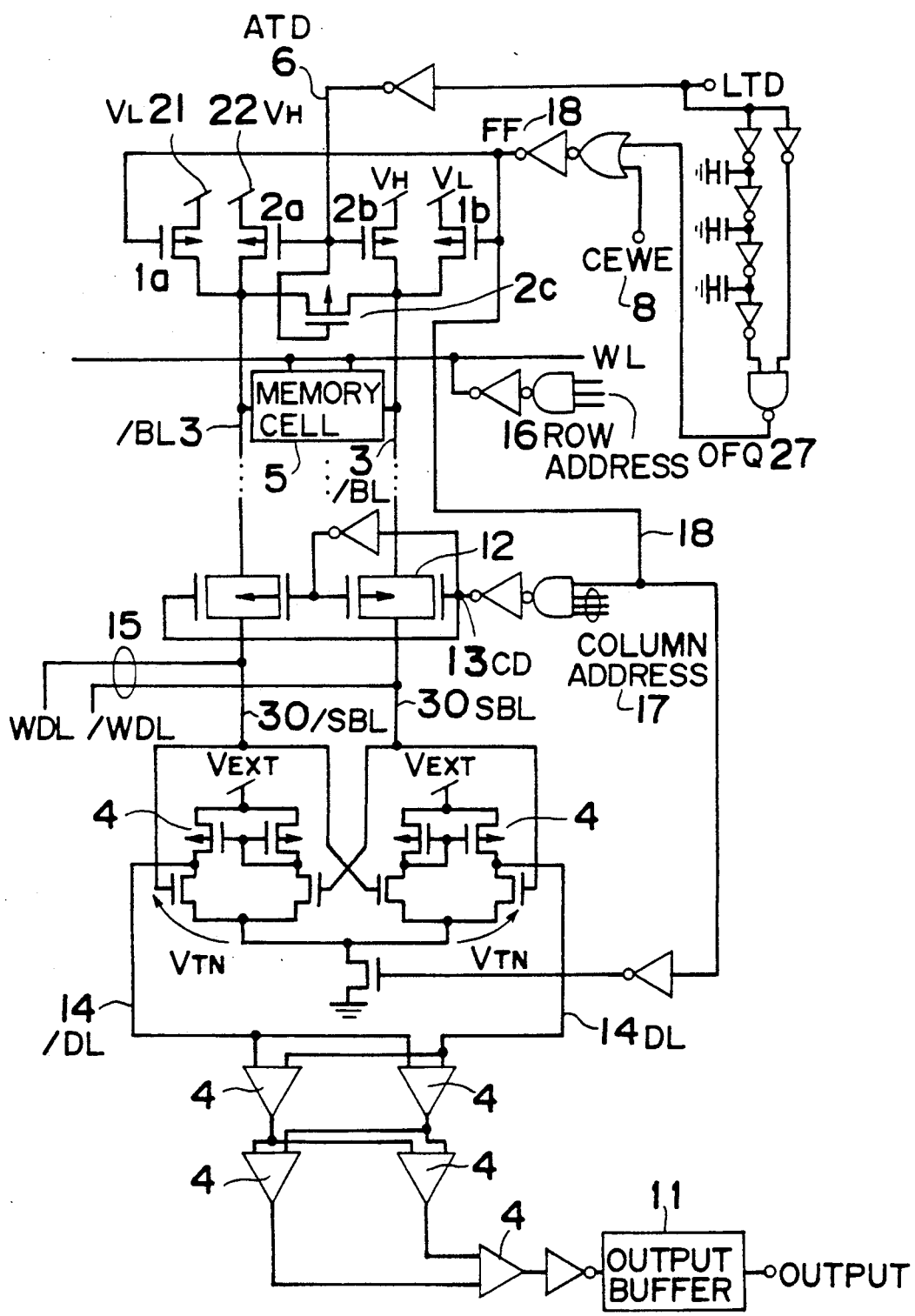
FIG. 10 is a circuit diagram showing a fifth embodiment of a reading circuit according to the present invention.
Figure 11:
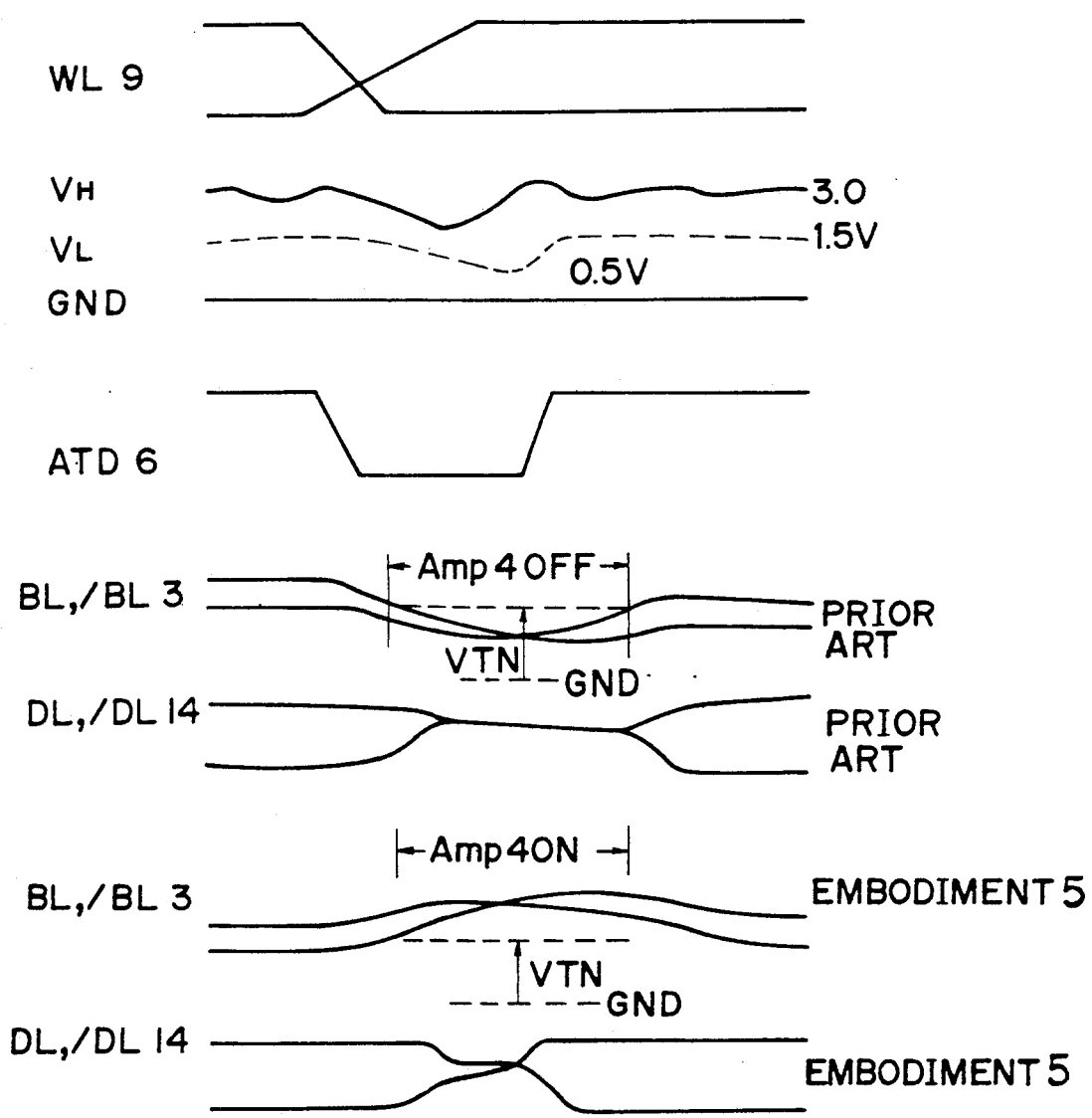
FIG. 11 is a view for explaining the operation of the same embodiment in comparison with its prior art.

Next a fifth embodiment of the present invention is described with reference to FIGS. 10 and 11. FIG. 10 shows a reading circuit according to the fifth embodiment of the invention. FIG. 11 shows a view for explaining the reading operation in comparison between the fifth embodiment of the invention and the conventional one.

The basic arrangement of the reading circuit is the same as the first embodiment as shown in FIGS. 1 and 2. For simplicity, like parts are indicated by like numerals throughout the following description, their detailed explanation being omitted.

In the first embodiment, both clamping operation and equalizing operation were implemented by the same supply voltage of the first power source 20.

By contrast, in the present embodiment, the clamping operation in which a voltage is applied in DC form is implemented by using a low voltage VL of the second power source 21 free from any problem in reliability while the equalizing operation is implemented by using a high voltage VH of the third power source 22 higher than the second voltage VL for the purpose of high speed operation. Thus, the equalizing operation can be carried out at high speed and with stability even when the supply voltage for the clamping operation is lowered, allowing a high-speed reading operation.

The reading circuit of the fifth embodiment shown in FIG. 10 is now described with reference to the operation comparative view of FIG. 11.

Along with miniaturization of devices involved in realizing high integration and high density of memories, circuit systems arranged to ensure the reliability by lowering the supply voltage within the chip have been adopted, where an external supply voltage of 5 V is lowered to 3 V in SRAMs of 4 M-bit or more and in DRAMs of 16 M-bit or more. In the future, even with the external supply voltage further lowered to 3 V, it is predicted that the inside of the chip may be lowered to 1.5 V in the case of DRAMs of 256 M-bit or so.

Then, as shown in FIG. 11 for example, in the period during which the row address 16 changes so that the selection of the word line 9 is being replaced by another, there flows a considerably much current such that the source line will fluctuate to a considerable extent inside the chip. If, the line fluctuates 1.0 V or so downward for example, the potential of the bit line 3 will further lower along with the equalizing operation, with the result that the potential lowers below the threshold value VTN of the input transistor of the succeeding-stage differential amplifier 4. Consequently the differential amplifier 4 turns off during the period, resulting in that the reading operation is considerably delayed.

By contrast, in the present embodiment, for the clamping period during which a voltage is applied in DC form, the bit line pair 3 is clamped with a internally dropped voltage, whereas for the equalizing period during which the source line will fluctuate to a large extent, the bit line pair 3 is raised to a high potential in pulse form by effecting the equalization using a high voltage that has not been subjected to internal drop. As a consequence, the differential amplifier 4 can be prevented from turning off, as has been the case with the conventional circuit, allowing a stable reading operation.

Although the above first to fifth embodiments have been described assuming a reading circuit for an SRAM, it is needless to say that the present invention may be applied to clamping circuits for use in reading circuits for semiconductor memories such as DRAMs and EPROMs without being limited to SRAMs.

Modified example

Figure 12:
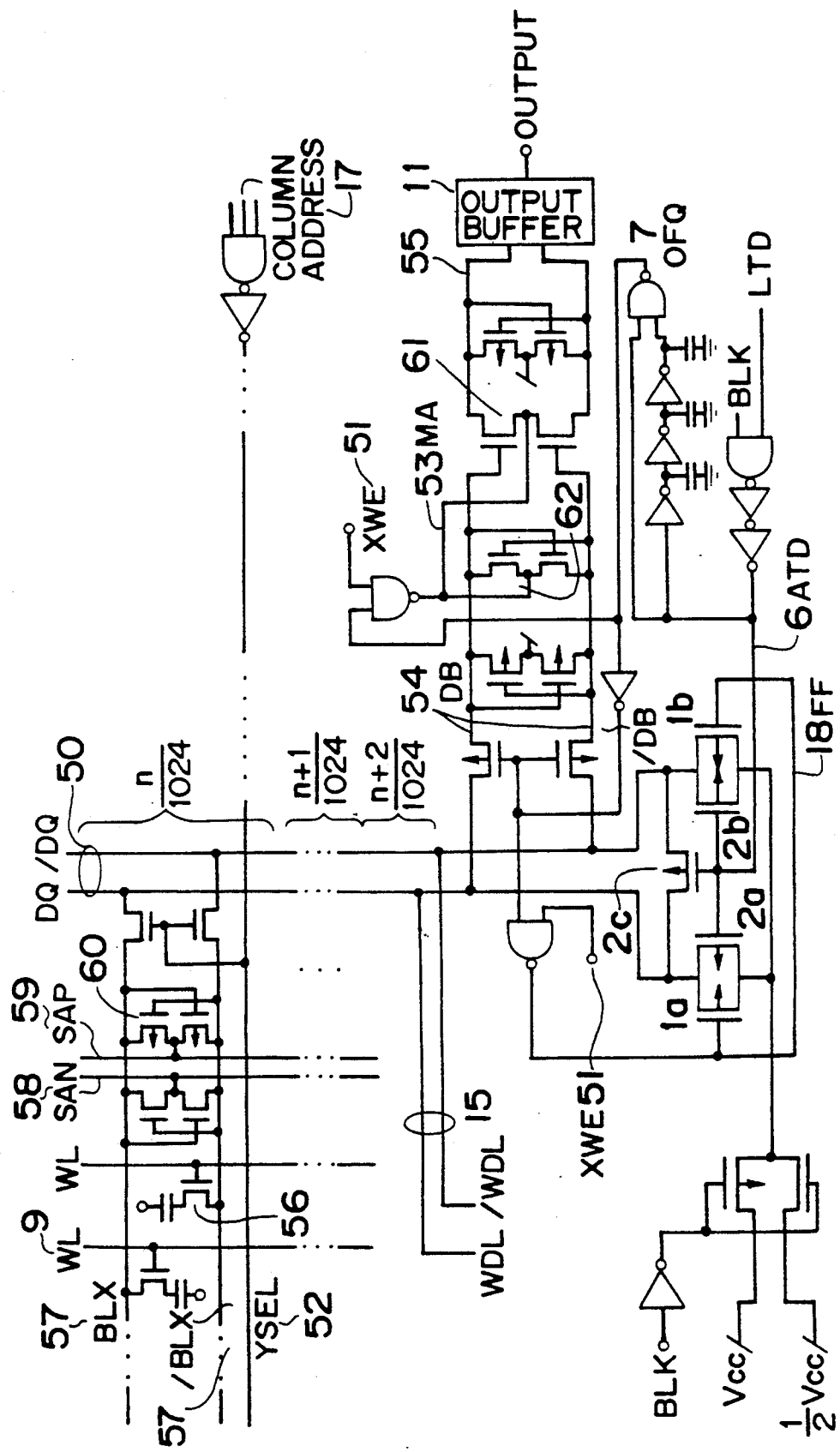
FIG. 12 is a circuit diagram in which the reading circuit of the second embodiment of the invention is applied to a DRAM.

As an example, shown in FIG. 12 is a circuit diagram in which the second embodiment of the present invention is applied to a DRAM.

Figure 13:
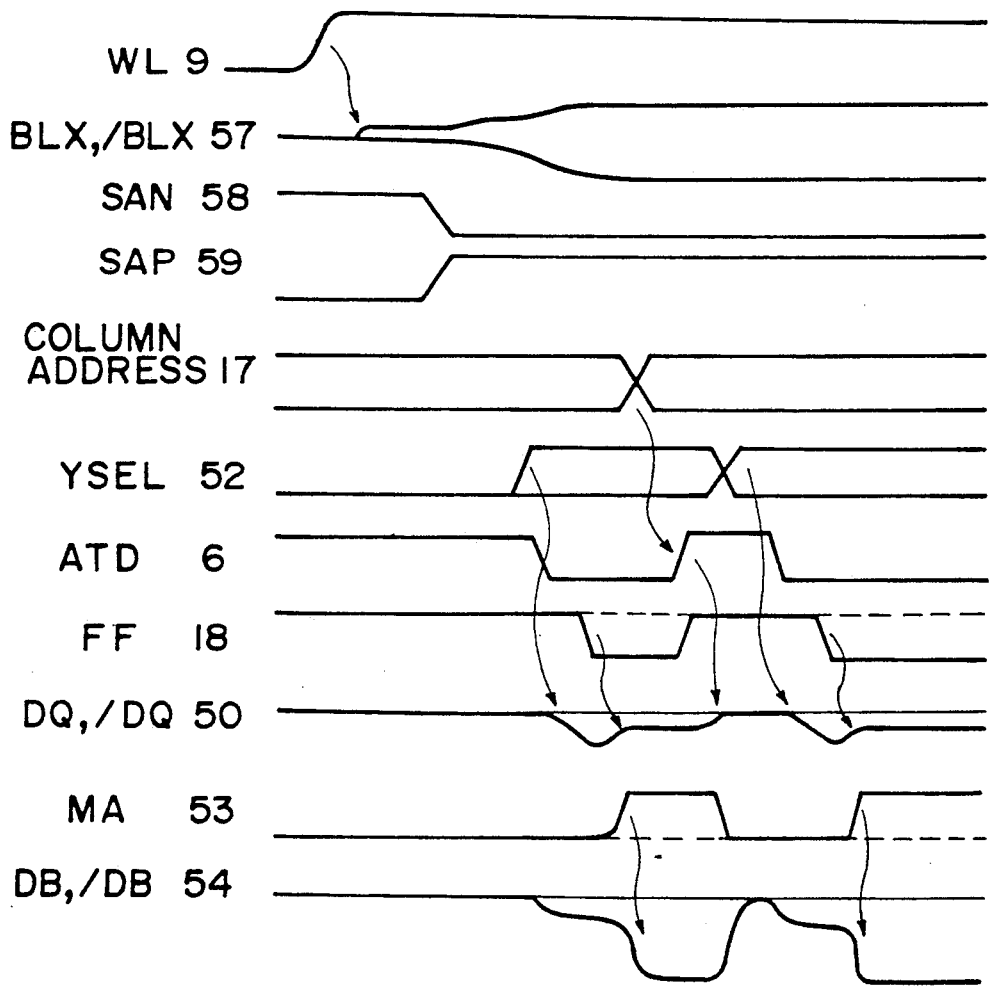
FIG. 13 is a view for explaining the operation of the DRAM as shown in FIG. 12.

FIG. 13 shows an explanatory view of the operation of the reading circuit for a DRAM shown in FIG. 12.

In FIG. 12, a memory cell 56 of the DRAM has a potential difference developed to a bit line pair (BLX, /BLX) 57 of the DRAM by selecting a word line 9. DRAMs involve destructive reading, as is not the case with SRAMs, thus requiring the read-out data to be written back using a sensing amplifier 60. The sensing amplifier 60 is activated by signal lines SAN (58) and SAP (59) to amplify the potential difference between the bit line pair 57 of the DRAM. Then the amplified data is latched. This latched state is the same as the latch system of the memory cell 5 of the SRAM shown in FIG. 16 (b). The reading of the DRAM is thereafter carried out by reading out the data of the sensing amplifier 60 to a data line pair (DQ, /DQ) 50 using a column selection line (YSEL) 52 selected by the column address 17.

As described above, the bit line pair 3 in the SRAM is equivalent to the data line pair 50 in the DRAM; the sensing amplifier 60 in the DRAM is equivalent to the memory cell 5 in the SRAM; and the word line 9 in the SRAM is equivalent to the column selection line (YSEL) 52 in the DRAM. In consequence, the clamping circuit in the modified example of present invention is to clamp the potential of the data line pair 50. A detection signal LTD is generated by detecting a transition of the column address, and by referencing the generated detection signal LTD, an equalizing signal ATD on the line 6 or a clamping signal FF on the line 18 will be generated.

The potential difference is read to the data line pair 50 by controlling the clamping signal FF via the line 18 in the state with the clamping released. The read-out potential difference is transferred to a line pair (DB, /DB) 54 serving as an input terminal of a differential amplifier 61 in pulse form, as described in the second embodiment. Thereafter the data line pair 50 and the input terminal 54 of the differential amplifier 61 are disconnected from each other with the clamping of the data line 50 being started simultaneously. The differential amplifier 61 is activated by using an activation signal MA (53). Then, the input terminal 54 of the differential amplifier 61 is abruptly amplified using a positive feedback amplifier 62 while a output line pair 55 of the amplifier 61 is also operated at high speed.

In a write operation, the control line 18 for feeding a clamping signal FF is fixed to high as indicated by a broken line in FIG. 13, where the clamping of the data line pair 50 is released unconditionally. Also in the differential amplifier 61, a control line (MA) 53 is fixed to low, without being activated.

As described above, the reading circuits of the first to fifth embodiments of the invention having the above-mentioned effects are applicable not only to the DRAMs but also to the other semiconductor memories.

As described above, the present invention is so arranged that the bit line pair and the input terminal of the succeeding-stage amplifier are disconnected from each other when the clamping of the bit line pair is started, allowing the input terminal of the succeeding-stage amplifier to be prevented from any decrease in potential difference, so that the succeeding-stage amplifier will operate at good stability. Also, the input terminal of the differential amplifier that has been reduced in load capacity to an extremely small one by virtue of the disconnection can be amplified at high speed using a positive-feedback amplifier that is a CMOS latch type sensing amplifier, so that the amplification speed of the differential amplifier can be increased. Thus, the present invention can offer great practical advantages in circuits for reading high-density, high-speed semiconductor memories.

Although the present invention has been fully described by way of example with reference to the accompanying drawings, it is to be noted here that various changes and modifications will be apparent to those skilled in the art. Therefore, unless otherwise such changes and modifications depart from the scope of the present invention as defined by the appended claims, they should be construed as included therein.

What is claimed is:

1. A reading circuit for a semiconductor memory in which, nearly concurrently with start of an operation of precharging a bit line pair to a first voltage supply source, clamping of said bit line pair is released while said bit line pair is connected to an input portion of a differential amplifier, said reading circuit comprising:

equalizing means comprising of first, second and third switch means, wherein said first and second switch means are interposed to connect said first voltage supply source to said bit line pair respectively, and said third switch means is connected across said bit line pair for short-circuiting said bit line pair;

clamping means comprising of fourth and fifth switch means which are interposed for connecting said bit line pair to said first voltage supply source respectively; and sixth and seventh switch means for connecting said bit line pair to the input portion of said differential amplifier, wherein said equalizing means is controlled by a first control line, and said clamping means is controlled by a second control line, and said sixth and seventh switch means are controlled by a third control line, and wherein said first control line turns on said equalizing means during a period of a first pulse width (ATD) fed via said first control line, and said third control line turns on said sixth and seventh switch means nearly concurrently when said equalizing means are turned on, and said third control line turns off the same after an elapse of a specified period, and said second control line turns on said clamping means for a period nearly equal to the duration during which said sixth and seventh switch means are held off.

2. The reading circuit for a semiconductor memory as claimed in claim 1, wherein said equalizing means are turned off and said sixth and seventh switch means are turned off at a timing a few nanoseconds later than the timing of turning off said equalizing means.

3. The reading circuit for a semiconductor memory as claimed in claim 1, wherein a second amplifier of flip-flop type to be controlled by a fourth control line is connected to the input portion of said differential amplifier, the fourth control line turning on said second amplifier for a period during which said sixth and seventh switch means are held off.

4. The reading circuit for a semiconductor memory as claimed in claim 1, wherein said equalizing means further comprises an eighth switch means (1c) which is connected across said bit line pair for short-circuiting said bit line pair and which is so controlled by said second control line as to effect equalization also in a clamping operation.

5. The reading circuit for a semiconductor memory as claimed in claim 4, wherein said equalizing means is constructed by only said third switch means for effecting equalization.

6. The reading circuit for a semiconductor memory as claimed in claim 1, wherein said first voltage supply source consists of second and third voltage supply sources (22, 21), said second voltage supply source (22) being connected to said bit line pair by way of said first and second switch means (2a, 2b) respectively while said third voltage supply source (21) being connected to said bit line pair by way of said fourth and fifth switch means (1a, 1b) respectively, and wherein the voltage of said third voltage supply source (21) is lower than that of said second voltage supply source (22).

* * * * *